United States Patent
Zeng et al.

(10) Patent No.: US 8,703,397 B1
(45) Date of Patent: Apr. 22, 2014

(54) METHOD FOR PROVIDING SIDE SHIELDS FOR A MAGNETIC RECORDING TRANSDUCER

(75) Inventors: Xianzhong Zeng, Fremont, CA (US); Hai Sun, Milpitas, CA (US)

(73) Assignee: Western Digital (Fremont), LLC, Fremont, CA (US)

( * ) Notice: Subject to any disclaimer, the term of this patent is extended or adjusted under 35 U.S.C. 154(b) by 32 days.

(21) Appl. No.: 13/434,514

(22) Filed: Mar. 29, 2012

(51) Int. Cl.
*G03F 7/26* (2006.01)

(52) U.S. Cl.
USPC ............ 430/319; 430/315; 430/320; 430/329

(58) Field of Classification Search
USPC .................................. 430/319, 320, 315, 329
See application file for complete search history.

(56) References Cited

U.S. PATENT DOCUMENTS

| | | | |
|---|---|---|---|
| 4,529,860 A | 7/1985 | Robb | |
| 5,017,459 A * | 5/1991 | McColgin | 430/299 |
| 5,332,653 A | 7/1994 | Cullen et al. | |
| 5,661,083 A | 8/1997 | Chen et al. | |
| 5,798,303 A | 8/1998 | Clampitt | |
| 5,798,897 A | 8/1998 | Chang et al. | |
| 5,994,226 A | 11/1999 | Kadomura | |
| 6,111,724 A | 8/2000 | Santini | |
| 6,309,976 B1 | 10/2001 | Lin et al. | |
| 6,451,706 B1 | 9/2002 | Chu et al. | |
| 6,586,560 B1 | 7/2003 | Chen et al. | |
| 6,627,355 B2 | 9/2003 | Levinson et al. | |
| 6,649,531 B2 | 11/2003 | Cote et al. | |
| 6,787,475 B2 | 9/2004 | Wang et al. | |
| 6,900,134 B1 | 5/2005 | Shih et al. | |
| 6,951,823 B2 | 10/2005 | Waldfried et al. | |
| 6,984,585 B2 | 1/2006 | Ying et al. | |
| 7,253,115 B2 | 8/2007 | Tanaka et al. | |
| 7,265,060 B2 | 9/2007 | Tsai et al. | |
| 7,297,638 B2 | 11/2007 | An et al. | |
| 7,371,507 B2 | 5/2008 | Myung | |
| 7,390,753 B2 | 6/2008 | Lin et al. | |
| 7,430,095 B2 | 9/2008 | Benakli et al. | |
| 7,522,379 B1 | 4/2009 | Krounbi et al. | |
| 7,547,669 B2 | 6/2009 | Lee | |

(Continued)

OTHER PUBLICATIONS

Cameron et al., 'Developable BARC (DBARC) Technology as a Solution to Today's Implant Lithography Challenges' Advances in Resist Materials and PRocessing Technology XVIII R. Allen, M. Somervell, Proc. of SPIE vol. 7972, 797214 1-10, Feb. 27, 2011.*

(Continued)

*Primary Examiner* — Cynthia Kelly
*Assistant Examiner* — Caleen Sullivan (57) ABSTRACT

A method for fabricating a side shield for a magnetic transducer is described. The magnetic transducer has a nonmagnetic layer and a pole on the nonmagnetic layer. The pole has sidewalls and an air-bearing surface location (ABS location) corresponding to an air-bearing surface (ABS). A developable bottom antireflective coating (D-BARC) layer covering the pole and at least a portion of the nonmagnetic layer is provided. The D-BARC layer is photosensitive. A photosensitive mask layer is provided on the D-BARC layer. A first portion of the mask layer and a first portion of the D-BARC layer are removed to form a bi-layer mask. The bi-layer mask has an aperture in the mask layer and the D-BARC layer. At least one side shield layer is deposited. At least a portion of the at least one side shield layer resides in the aperture. The bi-layer mask is also removed.

12 Claims, 8 Drawing Sheets

(56) References Cited

U.S. PATENT DOCUMENTS

| | | |
|---|---|---|
| 7,674,755 B2 | 3/2010 | Egbe et al. |
| 7,700,533 B2 | 4/2010 | Egbe et al. |
| 7,718,543 B2 | 5/2010 | Huang et al. |
| 8,231,796 B1 | 7/2012 | Li et al. |
| 8,277,669 B1 | 10/2012 | Chen et al. |
| 8,334,093 B2 | 12/2012 | Zhang et al. |
| 8,341,826 B1 | 1/2013 | Jiang et al. |
| 2001/0022704 A1 | 9/2001 | Hong |
| 2002/0034043 A1 | 3/2002 | Okada et al. |
| 2003/0100190 A1 | 5/2003 | Cote et al. |
| 2004/0214448 A1 | 10/2004 | Chan et al. |
| 2005/0141137 A1 | 6/2005 | Okada et al. |
| 2006/0044682 A1 | 3/2006 | Le et al. |
| 2006/0216649 A1 | 9/2006 | Paxton et al. |
| 2009/0029557 A1 | 1/2009 | Kikuchi et al. |
| 2009/0098490 A1 | 4/2009 | Pham et al. |
| 2009/0173977 A1 | 7/2009 | Xiao et al. |
| 2009/0192065 A1 | 7/2009 | Korzenski et al. |
| 2009/0246958 A1 | 10/2009 | Burns et al. |
| 2010/0112486 A1 | 5/2010 | Zhang et al. |
| 2010/0302680 A1 | 12/2010 | Hirata et al. |
| 2011/0147222 A1 | 6/2011 | Pentek et al. |
| 2011/0233167 A1 | 9/2011 | Pentek et al. |
| 2011/0262774 A1 | 10/2011 | Pentek et al. |
| 2011/0273800 A1 | 11/2011 | Takano et al. |
| 2011/0279926 A1 | 11/2011 | Si et al. |
| 2012/0050915 A1 | 3/2012 | Hong et al. |
| 2012/0125885 A1 | 5/2012 | Chen et al. |
| 2012/0127612 A1 | 5/2012 | Shin et al. |
| 2012/0237878 A1 | 9/2012 | Zeng et al. |

OTHER PUBLICATIONS

Brewster Scientific, Inc., "ARC DS-K101 MSDS sheet". 5 pages (Jan. 2009).

* cited by examiner

Prior Art
FIG. 1

Side View
Prior Art
FIG. 2

ABS View
Prior Art
FIG. 3

FIG. 4

Side View
FIG. 5

Top View
FIG. 6

METHOD FOR PROVIDING SIDE SHIELDS FOR A MAGNETIC RECORDING TRANSDUCER

BACKGROUND

Figure 1:
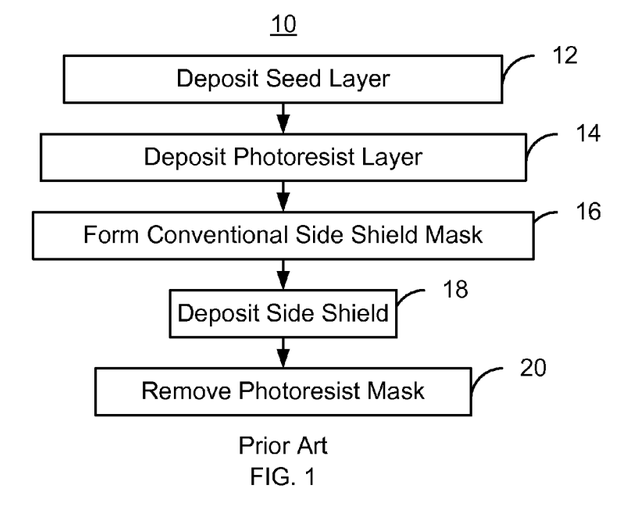
FIG. 1 is a flow chart depicting a conventional method for fabricating a side shield.

FIG. 1 is a flow chart depicting a conventional method 10 for fabricating a conventional perpendicular magnetic recording (PMR) transducer. For simplicity, some steps are omitted. The conventional method 10 is used for providing side shields after formation of a PMR pole. The sidewalls of the PMR pole typically have a reverse angle. Stated differently, the top of the PMR pole is wider than the bottom. In addition, the PMR pole may have a top (trailing edge) and/or a bottom (leading edge) bevel. The leading edge bevel is formed by forming a sloped surface in the layer on which the pole is formed. Prior to formation of the side shields, a trench may be formed in a nonmagnetic layer surrounding the PMR pole or a nonmagnetic gap layer may be deposited on the PMR pole. Thus, the PMR pole is separated from the region in which the side shields will be formed by a nonmagnetic layer. The write gap may also have been deposited before the conventional method 10 starts.

A seed layer for the conventional side shield is deposited, via step 12. A photoresist layer is deposited, via step 14. For example, the photoresist may be spin coated in step 14. A conventional photoresist shield mask is formed using conventional photolithography, via step 16. Thus, portions of the photoresist layer are exposed to light. The photoresist layer may then be immersed in a developer, which removes the portions that have been exposed to light. The material(s) for the wraparound side shield are deposited, via step 18. Finally, the conventional photoresist side shield mask may be removed, via step 20.

Figure 2:
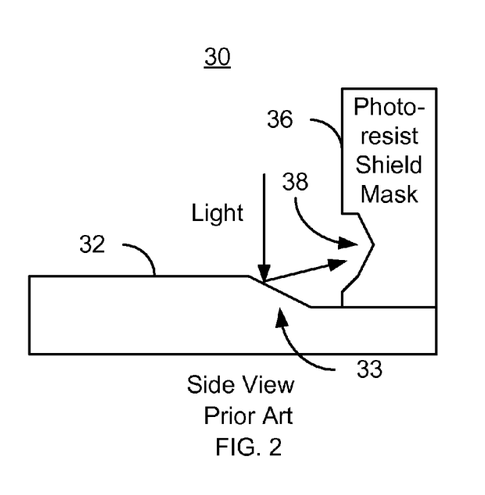
FIG. 2 depicts a side view of a conventional magnetic transducer.
Figure 3:
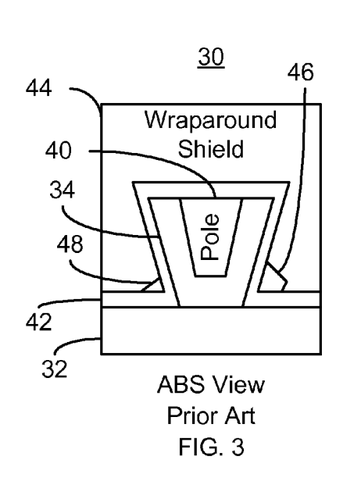
FIG. 3 depicts an ABS view of a conventional magnetic transducer.

FIGS. 2 and 3 depict side and air-bearing surface (ABS) views, respectively, of a portion of a conventional PMR transducer 30 formed using the conventional method 10. The conventional transducer 30 is shown during formation in FIG. 2. The conventional transducer 30 includes an intermediate layer 32. The intermediate layer 32 is the layer on which the pole is formed. Also shown is a bevel 33 used informing the leading edge bevel of the pole. Also shown is photoresist shield mask 36. The direction of light used in patterning the mask 36 is shown by straight arrows in FIG. 2. FIG. 3 depicts the conventional PMR transducer after fabrication is completed The Ru gap layer 34 which is deposited in the trench (not shown) is also depicted. The conventional pole 40, write gap 42 and wraparound shield 44 are also shown. For clarity, seed layer(s) are not separately depicted Although the conventional method 10 may provide the conventional PMR transducer 30, there may be drawbacks. As shown in FIG. 2, the photoresist mask 36 may exhibit notches 38. The resist notching 38 is near the base of the photoresist mask 36. As a result, the shield plated in step 18 may have an undesirable profile. Further, the notching 38 may not be controllable, particularly in high volume processes. As a result, yield and/or performance for the conventional PMR transducer 30 may be adversely affected. Further, as can be seen in FIG. 3, resist residue 46 and 48 from the photoresist mask 36 may be present. The reverse angle of the conventional pole 40 (e.g. top being wider than the bottom) and associated structures may result in an inability to remove portions of the resist mask 36 from the shadowed regions near the bottom of the conventional pole 40. As a result, the typically organic resist residue 46 and 48 may be present in the final device. This resist residue 46 and 48 occupies regions that are desired to be part of the wraparound shield 44. Consequently, performance and/or yield may again degrade.

Accordingly, what is needed is an improved method for fabricating a side shields for transducer, such as a PMR transducer.

SUMMARY

A method for fabricating a side shield for a magnetic transducer is described. The magnetic transducer has a nonmagnetic layer and a pole on the nonmagnetic layer. The pole has sidewalls and an air-bearing surface location (ABS location) corresponding to an air-bearing surface (ABS). A developable bottom antireflective coating (D-BARC) layer covering the pole and at least a portion of the nonmagnetic layer is provided. The D-BARC layer is photosensitive. A photosensitive mask layer is provided on the D-BARC layer. A first portion of the mask layer and a first portion of the D-BARC layer are removed to form a bi-layer mask. The bi-layer mask has an aperture in the mask layer and the D-BARC layer. At least one side shield layer is deposited. At least a portion of the at least one side shield layer resides in the aperture. The bi-layer mask is also removed.

DETAILED DESCRIPTION OF THE PREFERRED EMBODIMENTS

Figure 4:
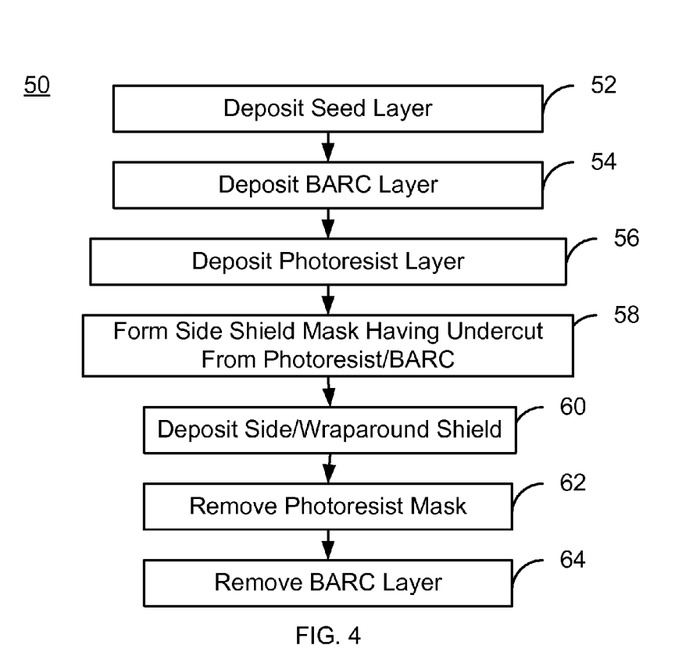
FIG. 4 is a flow chart depicting a more recent method for fabricating a side shield.
Figure 5:
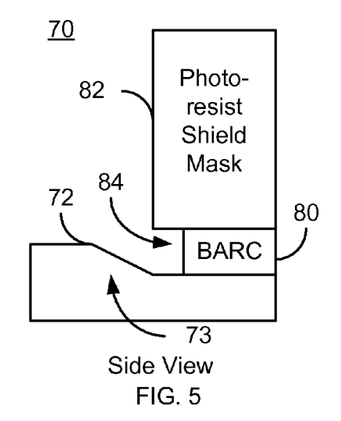
FIG. 5 depicts a side view of a more recent magnetic transducer.
Figure 6:
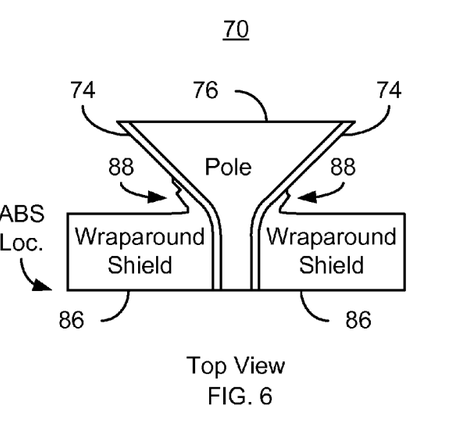
FIG. 6 depicts a top view of a more recent magnetic transducer.

FIG. 4 is a flow chart depicting a more recently developed method 50 for fabricating a magnetic recording transducer. The magnetic recording transducer may be a PMR transducer. FIGS. 5 and 6 depict the transducer 70 during and after fabrication of the side shields. For simplicity, some steps are omitted and only some components are shown. Referring to FIGS. 4-6, the more recent method 50 is used for providing side shields after formation of a pole. The sidewalls of the pole typically have a reverse angle. Stated differently, the top of the pole is wider than the bottom. In addition, the pole may have a top (trailing edge) and/or a bottom (leading edge) bevel. The leading edge bevel is formed by forming a sloped surface in the layer on which the pole is formed. Prior to formation of the side shields, a trench may be formed in a nonmagnetic layer surrounding the pole or a nonmagnetic gap layer may be deposited on the pole. Thus, the pole is separated from the region in which the side shields will be formed by a nonmagnetic layer. The write gap may also have been deposited before the conventional method 50 starts.

A seed layer for the side shield is deposited, via step 52. A bottom anti-reflective coating (BARC) layer is deposited on the seed layer, via step 54. A known material is generally preferred for the BARC layer because fabrication may be more predictable and it is generally believed that fewer changes will be required. In contrast, use of new materials is generally not preferred because side effects of such a new material may be unknown and/or unpredictable. The BARC may be developable, but is removed using a separate stripping process appropriate for the material. A photoresist layer is provided, via step 56. For example, the photoresist may be spin coated onto the BARC layer in step 56. A shield mask is formed using conventional photolithography, via step 58. Thus, portions of the photoresist layer are exposed to light. The photoresist layer may then be immersed in a developer, which removes the portions that have been exposed to light. In addition, portions of the BARC layer are also removed for a developable BARC. Thus a mask having an aperture therein for deposition of the side/wraparound shields is formed. The side shield mask formed in step 58 has an undercut. More specifically, the edge of the BARC layer does not extend as far as photoresist layer. FIG. 5 depicts the transducer 70 after step 58 is performed. The underlayer 72 on which the pole is formed may have a sloped surface 73 used to form a bevel in the pole. The BARC layer 80 and photoresist mask 82 are shown. In order to remove the BARC layer 80 from the desired locations, an undercut 84 is formed. This undercut 84 is formed in order to ensure that the BARC layer 80 is removed from the bottom of the pole (not shown). This undercut may be large. For example, the undercut may be as large as 0.65 µm. Because of the presence of the BARC layer 80, the photoresist mask 82 may not be notched.

The material(s) for the wraparound side shield are deposited, via step 18. Step 18 typically includes plating high permeability magnetic and/or other magnetic materials for the side/wraparound shield. The conventional photoresist side shield mask may be removed, via step 62. Step 62 typically includes stripping the photoresist mask 82. This photoresist strip does not remove materials such the developable BARC layer 80 described above. Consequently, the BARC 80 is separately removed after the photoresist mask 82 is gone, via step 64. This typically includes exposing the transducer 70 to the developer used for the BARC 80 after removal of the photoresist mask 82.

FIG. 6 depicts an ABS of a portion of the transducer 70 formed using the recently developed method 50. The transducer 70 includes a pole 76 and a gap layer 74 that may be formed prior to deposition of the pole. The gap layer 74 is typically Ru. There may also be other layers or components which are not shown. The side/wraparound shield 86 is also shown. For clarity, seed layer(s) are not separately depicted.

Use of the method 50 may avoid the presence of photoresist or other residue near the pole. Further, the shield 86 may not exhibit the undesirable profile due to notching of the photoresist mask 82. However, in order to ensure removal of the BARC layer 80 from regions near the pole 76 and to facilitate the method 50, the large undercut 84 shown in FIG. 5 is formed. This large undercut results in a large tail 88 for the shield 86. The presence of such a large tail may adversely affect performance of the transducer 70. Consequently, performance and/or yield may degrade.

Figure 7:
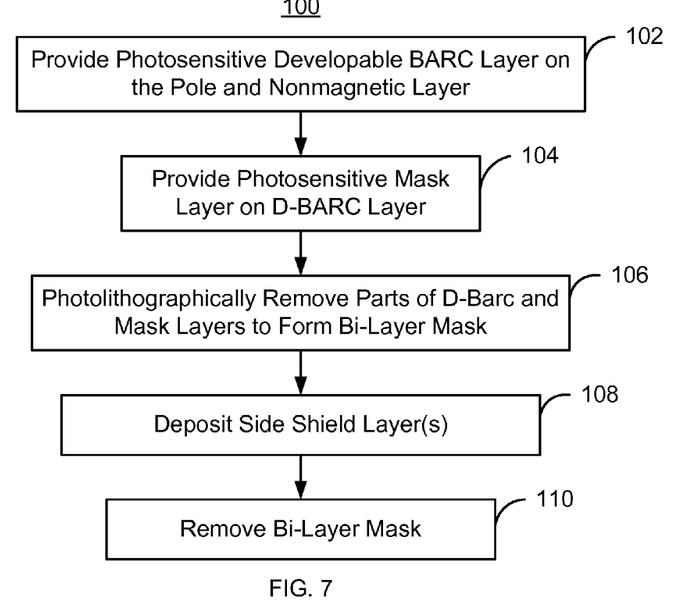
FIG. 7 is a flow chart depicting an exemplary embodiment of a method for fabricating a side shield.

FIG. 7 is a flow chart depicting an exemplary embodiment of a method 100 for fabricating a transducer. The method 100 is may be used in fabricating transducers such as PMR or energy assisted magnetic recording (EAMR) transducers, though other transducers might be so fabricated. For simplicity, some steps may be omitted, performed in another order, and/or combined. The magnetic recording transducer being fabricated may be part of a merged head that also includes a read head (not shown) and resides on a slider (not shown) in a disk drive. The method 100 is also described in the context of an ABS location. The ABS location is the location at which the ABS will be, for example after lapping of the transducer. Further, although termed a side shield, the shield(s) fabricated may include wraparound shields having at least top and side portions. The method 100 also may commence after formation of other portions of the transducer. The method 100 is also described in the context of providing a single set of side shields and their associated structures in a single magnetic recording transducer. However, the method 100 may be used to fabricate multiple transducers at substantially the same time. The method 100 and system are also described in the context of particular layers. However, in some embodiments, such layers may include multiple sub-layers. In one embodiment, the method 100 commences after formation of the pole in a nonmagnetic intermediate layer. In some embodiments, the intermediate layer is an aluminum oxide layer. The nonmagnetic intermediate layer as well as the pole may reside on an underlayer. Further, in some embodiments, a leading edge shield and/or a leading edge bevel are desired. In such embodiments, the leading edge shield may be provided under the underlayer. The leading edge shield is generally ferromagnetic, magnetically soft, and may include materials such as NiFe. In such embodiments, the underlayer may also have a sloped surface corresponding to the leading edge bevel desired in the pole. In such embodiments, the sloped surface may extend to the ABS location or a surface perpendicular to the ABS location may be between the sloped surface and the ABS location. In addition to the pole, a nonmagnetic gap layer may reside between the sidewalls of the pole and the nonmagnetic layer. In some embodiments, part of the nonmagnetic gap layer may also be under the pole. In some embodiments, a pole seed layer is also provided. The pole seed layer may be magnetic or nonmagnetic. In addition, prior to the method 100 commencing, a portion of the underlayer may be removed, forming a trench in which the side shield is to be fabricated. The seed layer for the side shield may be deposited prior to the method 100 starting.

A developable bottom antireflective coating (D-BARC) layer is provided, via step 102. The D-BARC layer covers the pole and at least a portion of the nonmagnetic layer. For example, the D-BARC layer covers the sloped surface, if any, of the nonmagnetic layer that corresponds to a leading edge bevel in the pole. The D-BARC layer is photosensitive. Thus, the D-BARC layer may be patterned photolithographically in a manner akin to photoresist. In some embodiments, the D-BARC layer includes AR602 (a D-BARC) by DOW Chemical. In some such embodiments, the D-BARC layer consists of AR602 (a D-BARC).

A mask layer is provided on the D-BARC layer, via step 104. The mask layer is also photosensitive. The mask layer may thus include a photoresist. In some embodiments, the D-BARC layer is sensitive to the light in a first wavelength range and the mask layer is sensitive to the light in a second wavelength range. In some embodiments, the second wavelength range overlaps the first wavelength range. In some such embodiments, the mask layer and D-BARC layer are sensitive to the same wavelength ranges. Having sensitivity to overlapping wavelength ranges may allow the mask layer and D-BARC layer to be patterned in a single set of substeps.

A first portion of the mask layer and a first portion of the D-BARC layer are photolithographically removed to form a bi-layer mask, via step 106. Step 106 may include exposing the first portion of the mask layer and the first portion of the D-BARC layer to light to which the layers are photosensitive and then exposing to a developer the mask layer and the D-BARC layer. In such embodiments, the D-BARC layer and the mask layer may be sensitive wavelength ranges that overlap and may be removed using the same developer. In alternate embodiments, the mask layer and D-BARC layer may be exposed to different wavelength ranges and/or different developers may be used. In such embodiments, the first portion of the mask layer may be removed first, then the D-BARC layer exposed to the appropriate light and developer. Alternatively, both layers may be exposed to light of the appropriate wavelength ranges, the developer for the mask layer used, and then the developer for the D-BARC layer used. However, to simplify processing it is desirable for the D-BARC layer and mask layer to have overlapping or identical wavelength ranges and use the same developer. Thus, using step 106, a bi-layer mask having aperture(s) in the mask layer and the D-BARC layer in location(s) corresponding to the desired location(s) of the side shields may be formed. In some embodiments, the patterning in step 108 results in an undercut in the D-BARC layer adjoining the aperture(s). However, in such embodiments, the undercut is smaller than the undercut 84 in the BARC layer 80 depicted in FIG. 5.

Referring back to FIG. 7, one or more high permeability/magnetic layer(s) for the side shields are deposited, via step 108. Step 108 may include plating one or more high permeability layers. At least part of these side shield layer(s) is in the aperture(s) in the mask and D-BARC layers of the bi-layer mask.

The bi-layer mask is removed after deposition of the side shield layer(s), via step 110. In some embodiments, the same process may be used to remove both the D-BARC layer and the mask layer. For example, a photoresist strip may remove both the D-BARC layer and the mask layer. In addition, any extraneous side shield seed layer may be removed. Formation of the magnetic transducer may then be completed.

Figure 8:
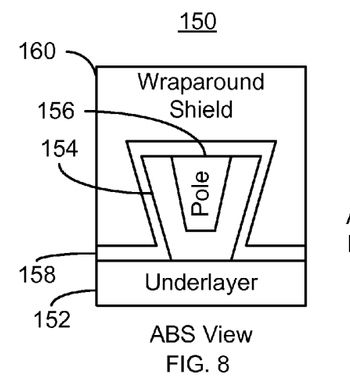
FIG. 8 is a diagram depicting an exemplary embodiment of a magnetic transducer having side shields during fabrication.
Figure 9:
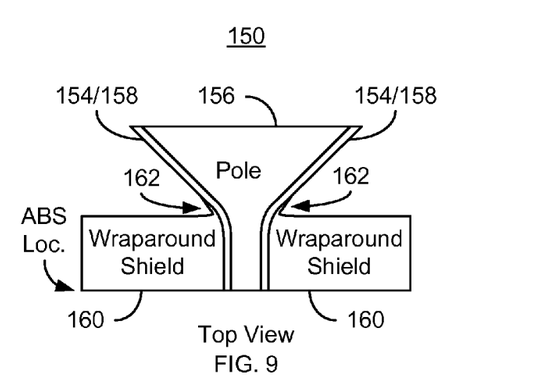
FIG. 9 depicts an ABS view of a side view of a magnetic transducer.

FIGS. 8 and 9 are diagrams depicting an exemplary embodiment of a portion of a magnetic transducer 150 having side shields that may be formed using the method 100. FIG. 8 depicts an ABS view, while FIG. 9 depicts a top view. For clarity, FIGS. 8 and 9 are not to scale and not all components of the transducer 150 are shown. The magnetic transducer 150 may be part of a merged heat that includes at least one read transducer (not shown) in addition to at least one magnetic transducer 150. The magnetic transducer 150 includes an underlayer 152, which may reside on a bottom shield (not shown). Also shown are a nonmagnetic layer 154, pole 156, a gap and/or seed layer 158, and side shield 160. The side shield 160 shown is a wraparound shield. In other embodiments, the top portion of the side shield 160 may be removed such that only the side portions remain.

Using the method 100, side shield 160 having the desired geometry may be fabricated. Because the D-BARC layer (not shown in FIGS. 8-9) is used, notching of the mask (not shown in FIGS. 8-9) may be prevented. Further, because it is photosensitive, the D-BARC layer need not have a large undercut. Because the undercut used is small, the plating tail of the side shield 160 may be reduced. For example, as can be seen in FIG. 9, the plating tail 162 may be significantly reduced over that shown in FIG. 6. Performance of the transducer 150 may thus be enhanced. In some embodiments, the plating tail 162 may be eliminated. This may further improve performance of the transducer 150. Further, the D-BARC layer and mask layer may be removed using the same process in some embodiments. As a result, processing may be simplified. Stated differently, manufacturing cost and cycle time may be reduced.

Figure 10:
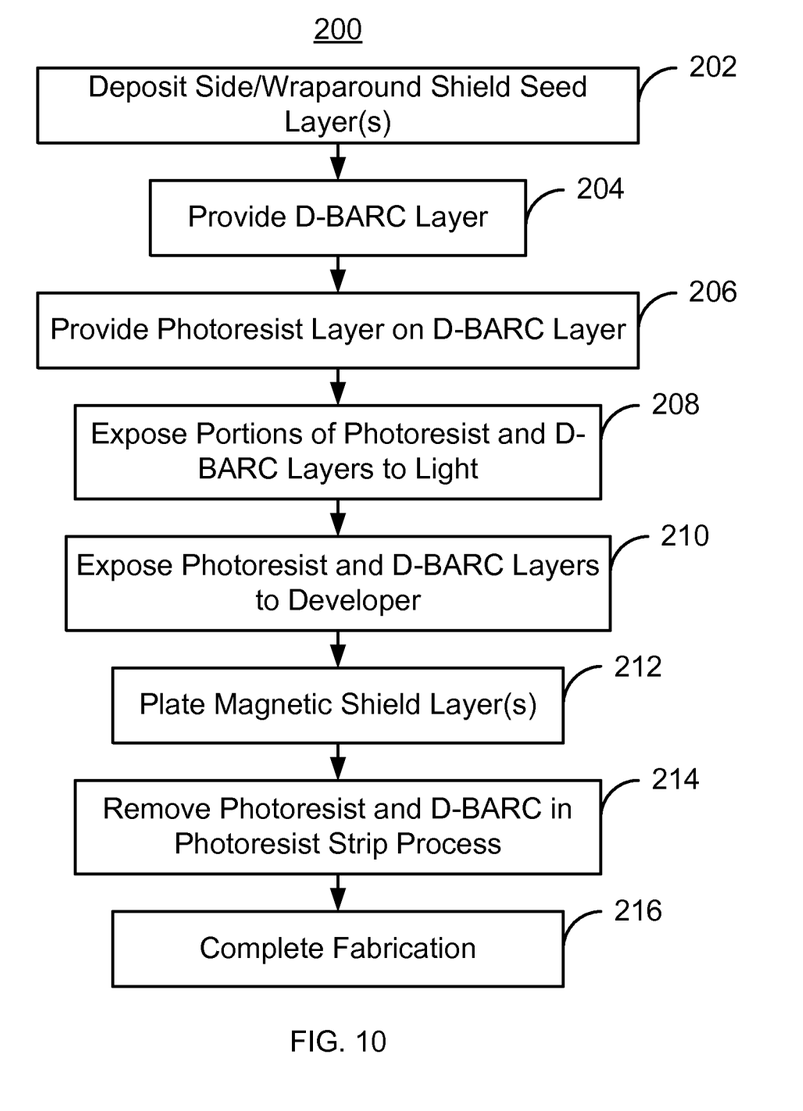
FIG. 10 is a flow chart depicting another exemplary embodiment of a method for fabricating side shields for a magnetic recording transducer.

FIG. 10 is a flow chart depicting another exemplary embodiment of a method 200 for fabricating a transducer. The transducer may be a PMR transducer, and EAMR transducer, or another writer. For simplicity, some steps may be omitted. FIGS. 11-19 are diagrams depicting an exemplary embodiment of a portion of a transducer during 250 fabrication. For clarity, FIGS. 11-19 are not to scale. Referring to FIGS. 10-19, the method 200 is described in the context of the transducer 250. However, the method 200 may be used to form another device (not shown). The transducer 250 being fabricated may be part of a merged head that also includes a read head (not shown in FIGS. 11-19) and resides on a slider (not shown) in a disk drive. The method 200 also may commence after formation of other portions of the transducer 250. For example, the leading shield (if any), underlayer with an optional sloped surface, pole optionally including a bevel, and trenches in which the side shields are to be formed may be fabricated before the method 200 commences. The method 200 is also described in the context of providing a single transducer 250. However, the method 200 may be used to fabricate multiple transducers at substantially the same time. The method 200 and device 250 are also described in the context of particular layers. However, in some embodiments, such layers may include multiple sublayers.

Figure 11:
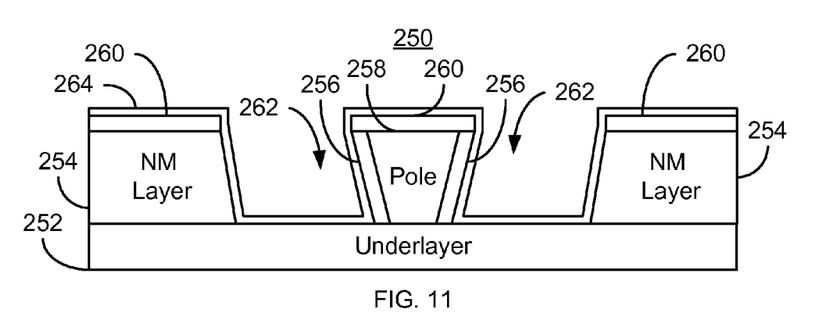
FIGS. 11-19 are diagrams depicting an exemplary embodiment of a magnetic recording transducer during fabrication.

A seed layer is deposited for the side shields, via step 202. In some embodiments, the seed layer is magnetic. In other embodiments, the seed layer is nonmagnetic. In the embodiment shown, the seed layer is deposited before the side shield deposition mask, discussed below, is formed. However, in other embodiments, the side shield deposition mask may be provided first. FIG. 11 depicts the ABS location view of the transducer 250 after the step 202 of the method 200 is performed. Thus, the transducer 250 includes an underlayer 252, which may be nonmagnetic and may reside on a leading edge shield. Also shown is a nonmagnetic layer 254 that may be aluminum oxide. The pole 258 has been formed in the nonmagnetic layer 254. In the embodiment shown, nonmagnetic gap layer 256 does not separate the pole 258 from the nonmagnetic layer 254. In some embodiments, the gap layer 256 includes Ru. In some embodiments, the gap layer 256 may also reside under the pole 258. Layer(s) 260 that reside on the nonmagnetic layer 254 and pole 258 are also shown. The layer(s) 260 may include a gap layer and/or hard mask layer. The hard mask 260 is used in fabricating the pole 258. Trench(es) 262 formed in the nonmagnetic layer 254 and in which side shields are to be formed are also depicted. For clarity, trenches 262 are labeled only in FIG. 11. Also shown is the seed layer 264 deposited in step 202.

Figure 12:
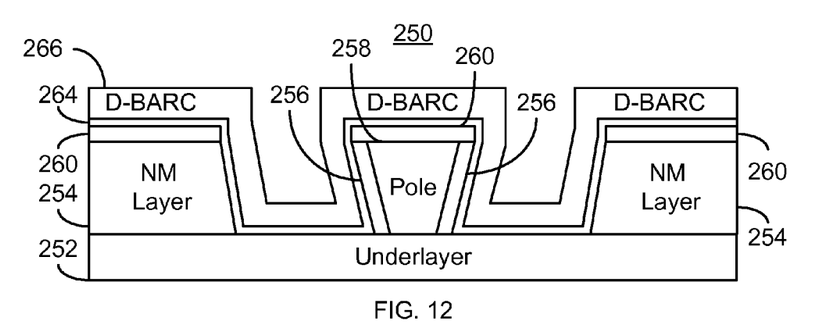

A D-BARC layer is provided on the transducer 250, via step 204. The D-BARC layer is photosensitive and removable using a photoresist stripping process. In some embodiments, step 204 includes depositing a layer of AR602 (a D-BARC) by DOW Chemical. FIG. 12 depicts an ABS view of the transducer after step 204 is performed. The D-BARC layer 266 is shown. The D-BARC layer 266 covers the pole 256, at least a portion of the nonmagnetic layer 254, and at least part of the side shield seed layer(s) 264. Because it used to reduce or eliminate reflections, the D-BARC layer 266 has a thickness configured to provide destructive interference of the light used in patterning the photoresist layer (described below).

Figure 13:
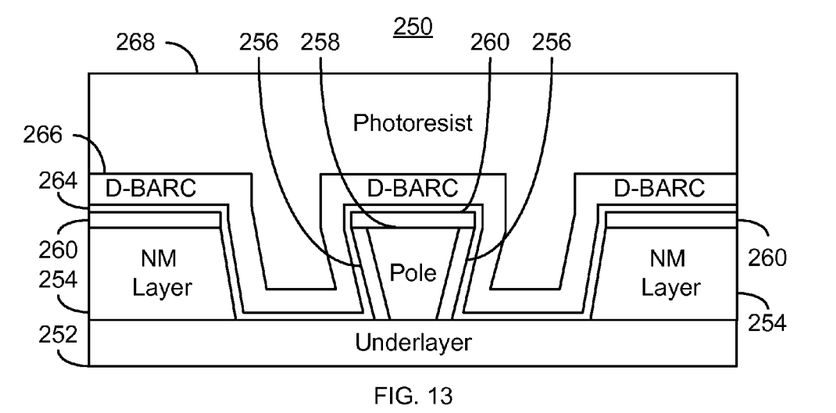

A photoresist layer is provided on the D-BARC layer 266, via step 206. In some embodiments, step 206 includes spin-coating the photoresist layer. FIG. 13 depicts the transducer 250 after step 206 is performed. Thus, photoresist layer 268 is shown. Because it is spin coated, the photoresist layer 268 may have a substantially flat top surface despite the topology of the underlying structures.

A first portion of the photoresist layer 268 and a first portion of the D-BARC 266 are exposed to light, via step 208. The photoresist layer 268 and the D-BARC layer 266 are sensitive to the light used in step 208. As discussed above, the wavelengths to which the photoresist layer 268 and the D-BARC layer 266 are sensitive may overlap. In such embodiments, a single exposure process may be used for both layers. However, in alternate embodiments in which the wavelength ranges do not overlap or do not overlap sufficiently, separate exposures may be used.

Figure 14:
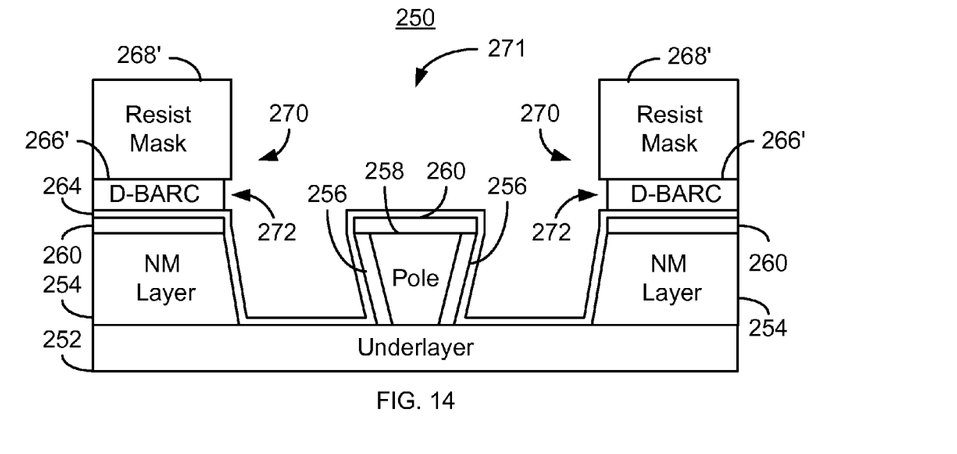
Figure 15:
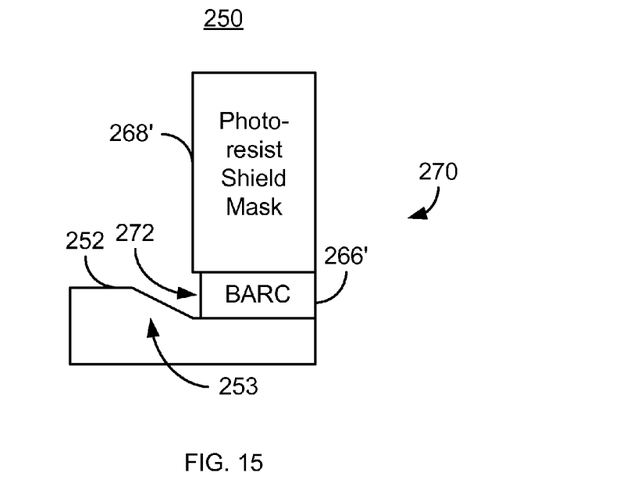

The D-BARC layer 266 and the photoresist layer 268 are exposed to at least one developer, via step 210. Step 210 is performed after step 208. In addition, step 210 may include one or more substeps, particularly if different developers are used for the D-BARC layer 266 and the photoresist layer 268. However, it is desirable for the same developer and a single step to be employed. The developer(s) are used to remove the first portion of the D-BARC layer 266 and the first portion of the photoresist layer 268 to form a bi-layer mask having an aperture therein. FIGS. 14 and 15 depict ABS and side views, respectively, of the transducer 250 after step 210 has been performed. Thus, a mask 270 has been formed from D-BARC layer 266' and photoresist layer 268'. The mask 270 includes an aperture 271 in which the side shield(s) are to be deposited. In some embodiments, the bi-layer mask 270 does have a small undercut 272 at the edges of the aperture 271. In some embodiments, the undercut 272 may be negligible or nonexistent in some or all regions. Also shown in FIG. 15 is the sloped surface 253 corresponding to the desired bevel in the pole 258. As can be seen in FIG. 15, because of the use of the D-BARC layer 266, the photoresist mask 268' exhibits little or no notching.

Figure 16:
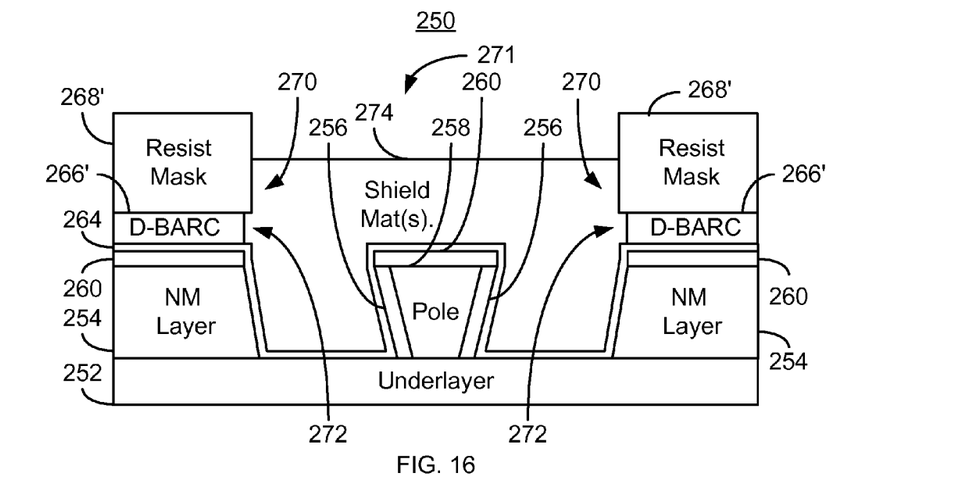

The material(s) for the side shield are deposited, via step 212. In some embodiments, step 212 includes plating the side shield material(s), such as NiFe. Thus, high permeability material(s) may be plated in step 212. FIG. 16 depicts the transducer 250 after step 212 is performed. Thus, the side shield material 274 is shown. For clarity, the side shield material 274 is shown only in the aperture 271 of the bi-layer mask 270. No side shield material is shown on top of the bi-layer mask 270. Note that part of the side shield materials fill the small undercut in the mask 270.

Figure 17:
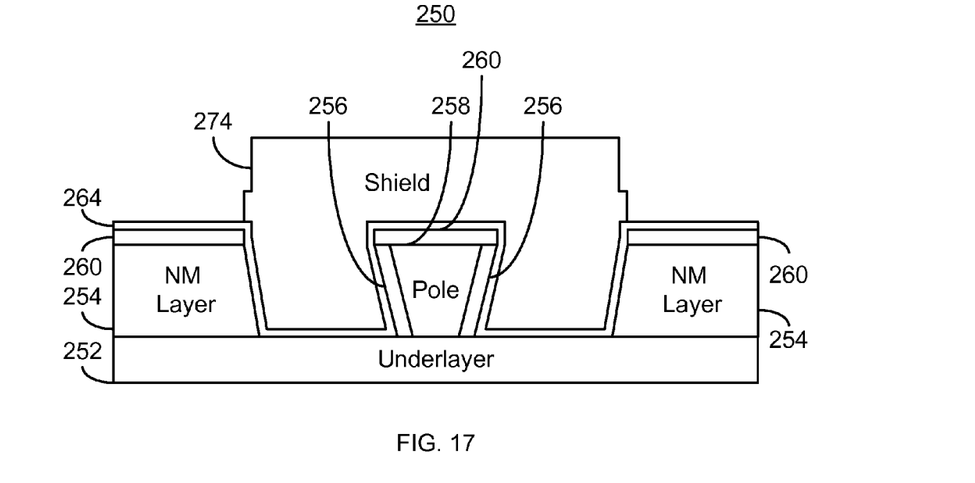
Figure 18:
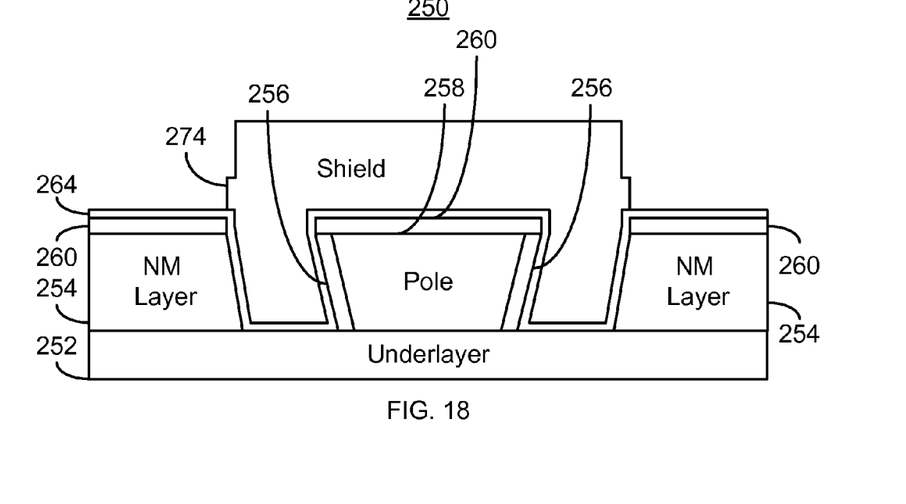
Figure 19:
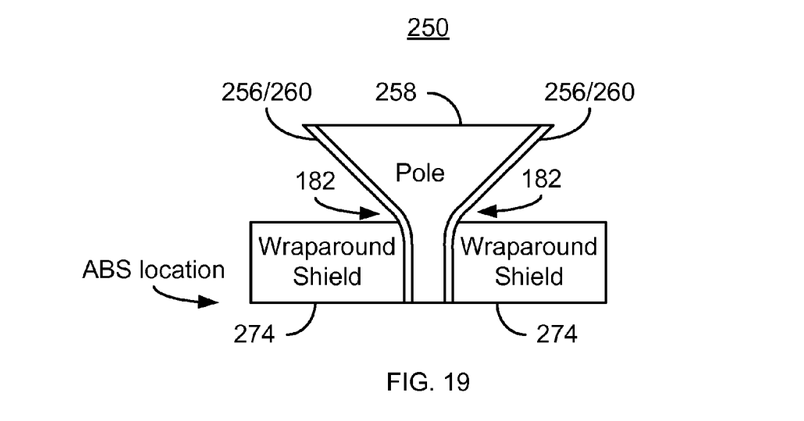

The bi-layer mask is removed after deposition of the side shield materials 274 in a single resist stripping process, via step 214. Both the D-BARC layer 264' and the photoresist layer 268' are removed in step 214. FIGS. 17-19 depict the transducer 250 after step 214 is completed. FIG. 17 depicts an ABS location view of the transducer 250. FIG. 18 depicts a yoke view of the transducer 250. Thus, the view shown in FIG. 18 is taken at a location parallel to the ABS location. FIG. 19 depicts a top view of the transducer 250. Thus, the mask 270 has been removed. The shield 274 that is a wrap-around shield remains. Further, as can be seen in FIGS. 17 and 18 no resist residue remains along the sidewalls of the pole 258. Further, as can be seen in FIG. 19, no plating tail remains. However, in some embodiments, a negligible or small plating tail may remain.

Fabrication of the transducer 250 is completed, via step 216. This may include removing the seed layer 264 not covered by the shield 274, depositing an additional nonmagnetic layer to cover the shield 274, and/or forming other components.

Thus, using the method 200, the transducer 250 may be fabricated. The transducer 250 may share the benefits of the transducer 150. The side shields 274 having the desired profile and little or no plating tail may be formed. The D-BARC 266' and resist mask 268' may be removed in the same step, which simplifies and speeds fabrication. The D-BARC 266' and resist mask 268' may also be photolithographically patterned in the same step(s), which simplifies and speeds fabrication. Thus, performance and fabrication of the transducer 250 may be improved.

We claim:

1. A method for fabricating a side shield for a magnetic transducer having a nonmagnetic layer and a pole on the nonmagnetic layer, the pole having sidewalls and an air-bearing surface location (ABS location) corresponding to an air-bearing surface (ABS), the method comprising:
providing a developable bottom antireflective coating (D-BARC) layer covering the pole and at least a portion of the nonmagnetic layer, the D-BARC layer being photosensitive;
providing a mask layer on the D-BARC layer, the mask layer being photosensitive;
photolithographically removing a first portion of the mask layer and a first portion of the D-BARC layer to form a bi-layer mask, the bi-layer mask having an aperture in the mask layer and the D-BARC layer;
depositing at least one side shield layer, at least a portion of the at least one side shield layer residing in the aperture; and
removing the bi-layer mask.

2. The method of claim 1 wherein the D-BARC layer is removable using a first process.

3. The method of claim 2 wherein the mask layer is removable using the first process and wherein the step of removing the bi-layer mask further includes:
removing the bi-layer mask after the at least one side shield layer is deposited using the first process.

4. The method of claim 3 wherein the mask layer is a photoresist layer and wherein the step of removing the bi-layer mask using the first process further includes:
stripping bi-layer mask.

5. The method of claim 1 wherein the step of photolithographically removing the first portion of the D-BARC layer and the first portion of the mask layer further includes:
exposing to light the first portion of the D-BARC layer and the first portion of the mask layer, the mask layer and the D-BARC layer being sensitive to the light; and
exposing the D-BARC layer and the mask layer to a developer after the step of exposing to the light.

6. The method of claim 5 wherein the D-BARC layer is sensitive to the light in a first wavelength range, the mask layer is sensitive to the light having a second wavelength range that overlaps the first wavelength range.

7. The method of claim 5 wherein the D-BARC layer further & consists of a single D-BARC material.

8. The method of claim 1 wherein the step of depositing the at least one side shield layer further includes:
depositing at least one seed layer before the step of providing the mask layer; and
depositing at least one magnetic layer after the step of photolithographically removing the first portion of the D-BARC layer and the mask layer.

9. The method of claim 8 wherein the step of depositing the at least one magnetic layer includes plating the at least one magnetic layer.

10. The method of claim 1 wherein the nonmagnetic layer has a first surface and a second surface, the first surface being substantially perpendicular to the ABS and crossing the ABS location, the second surface adjoining the first surface and at a nonzero angle to the first surface such that the nonmagnetic layer has a bevel.

11. The method of claim 10 wherein the pole includes a pole bevel corresponding to the bevel.

12. A method for fabricating a side shield for a magnetic transducer having a nonmagnetic layer and a pole on the nonmagnetic layer, the pole having sidewalls and an air-bearing surface location (ABS location) corresponding to an air-bearing surface (ABS), the method comprising:

depositing at least one side shield seed layer;

providing a developable bottom antireflective coating (D-BARC) layer covering the pole, at least a portion of the nonmagnetic layer, and at least part of the at least one side shield seed layer, the D-BARC layer being photosensitive and removable using a photoresist stripping process;

providing a photoresist layer on the D-BARC layer;

exposing to light a first portion of the photoresist layer and a first portion of the D-BARC, the photoresist layer and the D-BARC layer being sensitive to the light;

exposing the D-BARC layer and the photoresist layer to developer after the step of exposing to the light, the developer removing the first portion of the D-BARC layer and the first portion of the photoresist layer to form a bi-layer mask having an aperture therein, a part of the first portion of the D-BARC layer residing under a second portion of the photoresist layer different from the first portion of the photoresist layer such that the bi-layer mask has an undercut at the aperture;

plating at least one magnetic side shield layer, at least a portion of the at least one magnetic side shield layer residing in the aperture; and removing the bi-layer mask using the photoresist stripping process.

* * * * *